(12) United States Patent
Hu et al.

(10) Patent No.: US 6,207,500 B1
(45) Date of Patent: Mar. 27, 2001

(54) DRAM CHIP FABRICATION METHOD

(75) Inventors: Yin Hu; Dirk Noel Anderson, both of Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/140,711

(22) Filed: Aug. 26, 1998

Related U.S. Application Data
(60) Provisional application No. 60/057,231, filed on Aug. 29, 1997.

(51) Int. Cl.[7] ............ H01L 21/336; H01L 21/8242; H01L 29/788; H01L 29/76; H01L 29/94
(52) U.S. Cl. ............... 438/258; 438/241; 257/315; 257/408
(58) Field of Search ................... 438/241, 258, 438/265, 266; 257/315, 408

(56) References Cited

U.S. PATENT DOCUMENTS
5,324,680 * 6/1994 Lee et al. ................. 437/52

* cited by examiner

Primary Examiner—Wael Fahmy
Assistant Examiner—Neal Berezny
(74) Attorney, Agent, or Firm—Alan K. Stewart; Wade James Brady, III; Frederick J. Telecky, Jr.

(57) ABSTRACT

An improved method for forming a DRAM chip is disclosed. According to this method, a memory cell gate is deposited in a memory cell array area of the DRAM chip. The memory cell gate overlies a first channel area of a substrate. A peripheral gate is deposited in a peripheral area of the DRAM chip. The peripheral gate overlies a second channel area of the substrate. A first dopant is implanted with a first concentration in a first plurality of source and drain regions of the substrate lying predominantly outside the first and second channel areas of the substrate. A sidewall is then formed adjacent to the peripheral gate. Simultaneously, an insulating layer is formed over the memory cell array area of the DRAM chip. A second dopant is implanted with a second concentration in a second plurality of source and drain regions of the substrate within the peripheral area of the DRAM chip. The implant of the second dopant is blocked by the sidewall and the insulating layer. In one embodiment, the first and second dopants are the same, and the dopant concentration in the second plurality of regions is greater than the dopant concentration in the first plurality of regions. This method allows the formation of more heavily doped source and drain regions in the peripheral area of the DRAM chip while keeping the heavily doped regions separated from the channel regions. This reduces diffusion into the channel regions and allows a smaller design rule to be used.

9 Claims, 2 Drawing Sheets

DRAM CHIP FABRICATION METHOD

This application claims priority under 35 USC §119 (e) (1) of provisional application number 60/057,231, filed Aug. 29, 1997.

TECHNICAL FIELD OF THE INVENTION

This invention relates generally to semiconductor devices, and more particularly to an improved method for forming a DRAM chip.

BACKGROUND OF THE INVENTION

In the fabrication of dynamic random access memory (DRAM) arrays, gate material is typically patterned onto an insulating layer above a channel region. The gate material is typically surrounded by an insulating dielectric material deposited on top of the gate, with thin sidewalls extending down both sides of the gate. The dielectric material serves to insulate the gate from self-aligned source and drain contacts formed on either side of the gate.

In a DRAM array, the thickness of the insulating sidewalls is typically determined by the design rule and pitch of the array. For example, for a 0.3 micron design rule and a 0.6 micron pitch design, the sidewall thickness may be 500–700 Angstroms. For smaller design rules, the sidewall thickness may decrease to less than 300 Angstroms.

The DRAM array is typically surrounded on a chip by peripheral circuitry that includes metal oxide semiconductor field effect transistors (MOSFETs). To maximize efficiency in chip manufacturing, the gate deposition and insulating steps used in forming the DRAM array are typically used to simultaneously form the peripheral MOSFET gates. As a result, the sidewalls insulating the peripheral MOSFET gates will have the same thickness as the sidewalls in the DRAM array.

This peripheral sidewall thickness may not be the optimal thickness for MOSFET gate insulating sidewalls. For example, a source/drain implant is typically performed for peripheral MOSFETs after formation of the gate and insulating sidewalls, to separate the heavily doped portions of the source and drain regions from the channel region. This separation is necessary to prevent lateral diffusion of the source/drain dopant into the channel, and to reduce stress on the MOSFET device due to high electric fields at the source-channel junction and drain-channel junction.

Thus, if the design rule of the DRAM array does not allow for sufficiently thick sidewalls in the peripheral area, the physical channel lengths of the peripheral MOSFETs may have to be increased to maintain a given effective channel length due to lateral diffusion into the channel. Performance of the peripheral MOSFETs may also be affected due to increased stress at the source-channel and drain-channel junctions.

SUMMARY OF THE INVENTION

Therefore, a need has arisen for a DRAM chip fabrication method that addresses the disadvantages and deficiencies of the prior art.

An improved method for forming a DRAM chip is disclosed. According to this method, a memory cell gate is deposited in a memory cell array area of the DRAM chip. The memory cell gate overlies a first channel area of a substrate. A peripheral gate is deposited in a peripheral area of the DRAM chip. The peripheral gate overlies a second channel area of the substrate. A first dopant is implanted with a first concentration in a first plurality of source and drain regions of the substrate lying predominantly outside the first and second channel areas of the substrate. A sidewall is then formed adjacent to the peripheral gate. Simultaneously, an insulating layer is formed over the memory cell array area of the DRAM chip. A second dopant is implanted with a second concentration in a second plurality of source and drain regions of the substrate within the peripheral area of the DRAM chip. The implant of the second dopant is blocked by the sidewall and the insulating layer.

In one embodiment of the present invention, the first and second dopants are the same, and the dopant concentration in the second plurality of regions is greater than the dopant concentration in the first plurality of regions.

A technical advantage of the present invention is that the method allows the formation of more heavily doped source and drain regions in the peripheral area of the DRAM chip while keeping the heavily doped regions separated from the channel regions. Another technical advantage is that diffusion into the channel regions is reduced, which allows a smaller design rule to be used. Another technical advantage is that stress at the source-channel and drain-channel junctions may be reduced. Furthermore, the above-described method has no impact on the formation of the DRAM cell array itself. Yet another technical advantage is that, because the added steps of this method are self-aligning in nature, the "masking level" of the overall DRAM chip fabrication process is not increased.

BRIEF DESCRIPTION OF THE DRAWINGS

For a more complete understanding of the present invention and for further features and advantages thereof, reference is now made to the following description taken in conjunction with the accompanying drawings, in which.

DETAILED DESCRIPTION OF THE INVENTION

Figure 1:
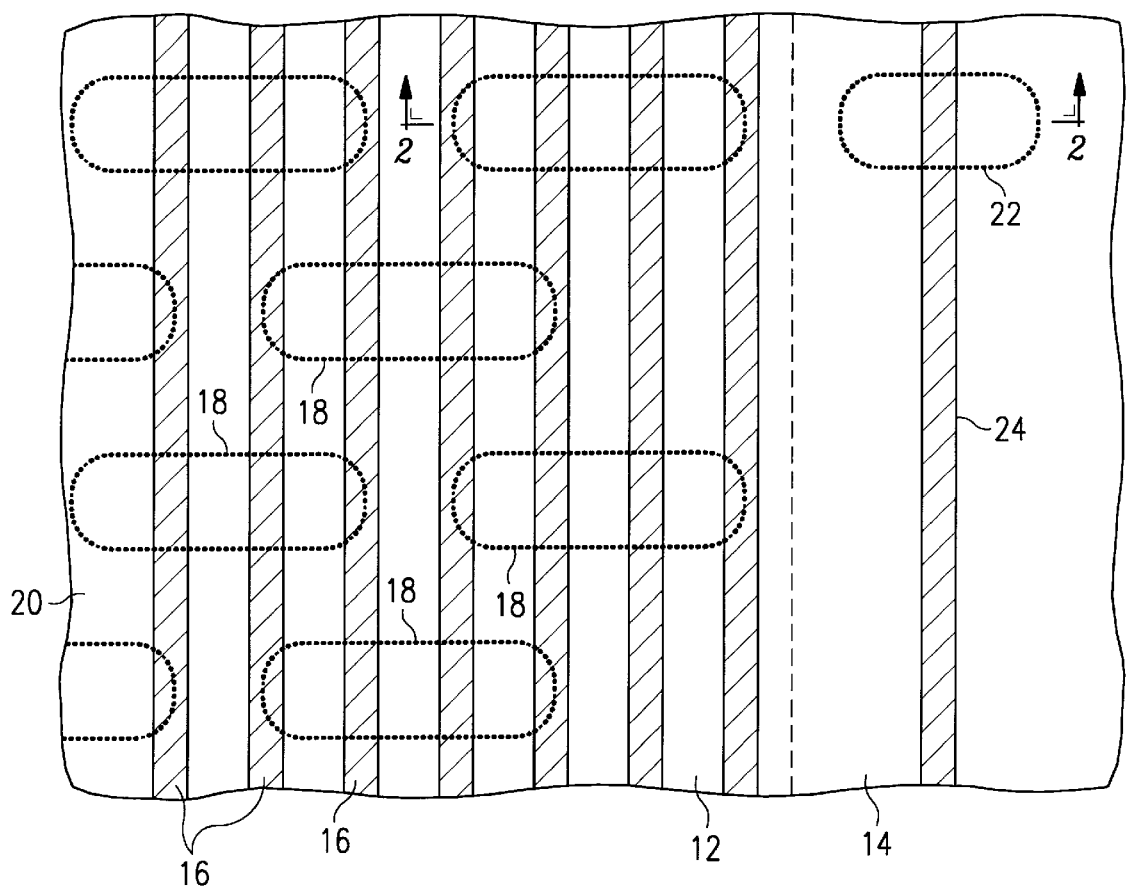
FIG. 1 is a top view of a portion of a DRAM chip fabricated in accordance with the present invention.

Referring to FIG. 1, a top view of a portion of a DRAM chip 10 is shown. DRAM chip 10 includes a memory cell array area 12 and a peripheral circuitry area 14. Memory cell array area 12 includes a plurality of wordlines 16 and a plurality of active areas 18. A field oxide 20 surrounds active areas 18.

In peripheral area 14, a single active area 22 and a single wordline 24 are shown for illustrative purposes. However, it will be understood that peripheral area 14 may comprise many MOSFETs and other circuit elements.

Figure 2A:
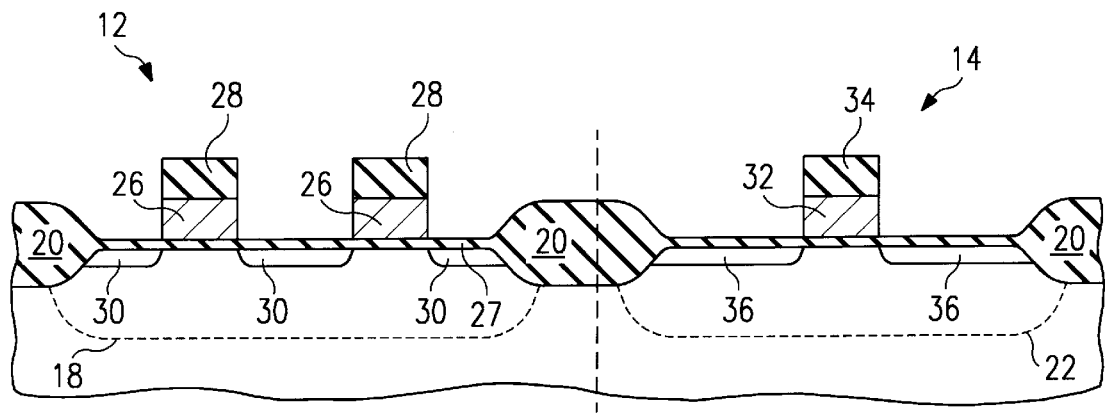
FIGS. 2A through 2D are cross sections of the DRAM chip at various stages of fabrication in accordance with the present invention.

FIGS. 2A through 2D illustrate a method for forming DRAM chip 10 in accordance with the present invention. Referring to FIG. 2A, a cross section of DRAM chip 10 is shown. In memory cell array area 12, two gates 26 comprising sections of wordlines 16 lie atop an insulating layer 27 and extend across a single active area 18, which may comprise a doped well formed using known methods. Gates 26 may comprise polysilicon or another conductive material. Field oxide 20 resting in isolation trenches serves to isolate active area 18 from adjacent active areas.

Overlying each gate 26 is an insulating layer 28 which, like insulating layer 27, may comprise silicon dioxide, silicon nitride or another insulating material. Gates 26 and insulating layers 28 are deposited, patterned and etched according to known methods. After the formation of gates 26, a lightly doped drain (LDD) implant is performed using well-known techniques to form source and drain areas 30. This implant may be performed using an n-type dopant such as phosphorus, arsenic or antimony. Alternatively, a p-type dopant may be used. Gates 26 and insulating layers 28 prevent the implant from reaching the areas underneath gates 26.

In peripheral area 14, a single gate 32 and insulating layer 34 overly an active area 22. Gate 32 and insulating layer 34 are formed simultaneously with gates 26 and insulating layers 28 in memory cell array area 12. The LDD implant that forms source and drain areas 30 in memory cell array area 12 also forms lightly doped areas 36 in peripheral area 14.

Figure 2B:
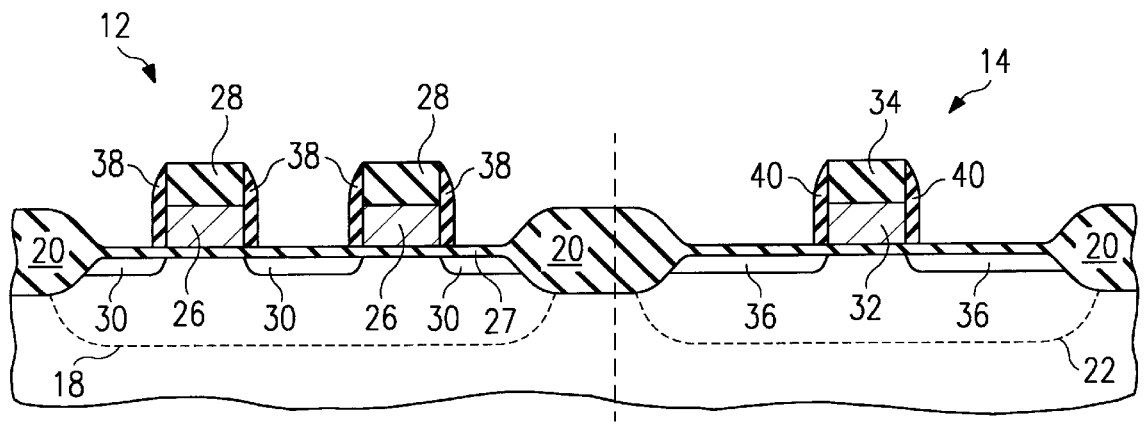

Referring to FIG. 2B, another insulating layer is deposited and etched using an anisotropic etchant to produce insulating sidewalls 38 around gates 26 and insulating sidewalls 40 around gate 32. Alternatively, the insulating layer could be left unetched so that sidewalls 38 and 40 form part of a continuous insulating layer. Insulating sidewalls 38 and 40 preferably comprise the same material as insulating layers 28 and 34. Insulating sidewalls 38 and 40 may, in an exemplary 0.16 micron design rule and 0.32 micron pitch design, have a thickness between 100 and 500 Angstroms. The formation of sidewalls 38 and 40 may occur before or after the LDD implant described above, according to the design specifications of the particular DRAM chip 10.

Figure 2C:
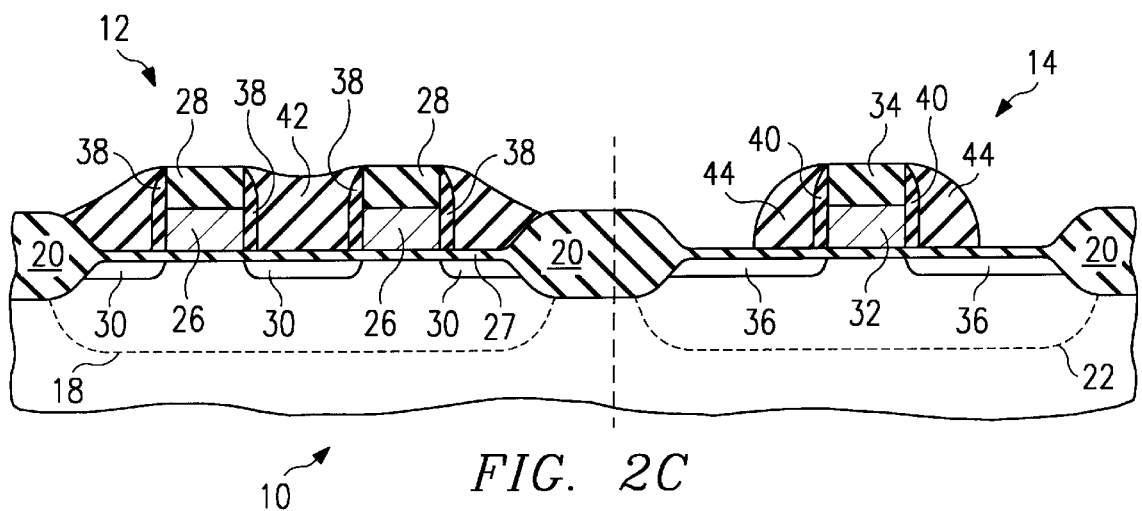

Referring to FIG. 2C, another insulating layer 42 is deposited and etched using an anisotropic etchant. As a result of the anisotropic etching, additional sidewalls 44 are formed around gate 32 in peripheral area 14. Insulating layer 42 preferably comprises a different insulating material than that used to form sidewalls 38 and 40. Insulating layer 42 is preferably capable of being etched away using a selective etchant without removing sidewalls 38 and 40.

Insulating layer 42 is preferably deposited with a thickness greater than or approximately equal to the pitch, or distance between adjacent gates 26, for memory cell array area 12. Thus, when insulating layer 42 is etched using an anisotropic etchant, regions of insulating layer 42 between gates 26 are not removed by the etchant. This is important for reasons discussed below. Beyond this minimum thickness, the preferred thickness of insulating layer 42 is determined by the desired thickness of sidewalls 44 in peripheral area 14.

Figure 2D:
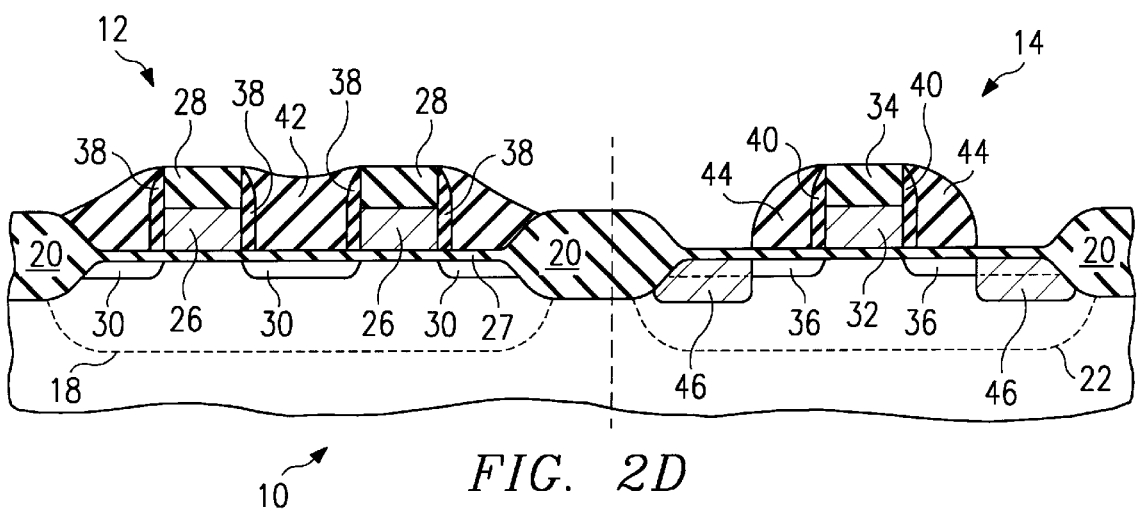

Referring to FIG. 2D, a source/drain implant is performed next. This implant, which may use the same n-type dopant as was used to form lightly doped areas 36, creates source and drain areas 46 in peripheral area 14. Source and drain areas 46 have higher doping levels than lightly doped areas 36. However, because sidewalls 44 block this source/drain implant, only lightly doped areas 36 border the channel region underlying gate 32. Thus, the benefits of heavily doped source and drain areas 46 may be obtained while minimizing the negative effects caused by lateral diffusion of source/drain dopant into the channel and stress on the MOSFET device due to high electric fields at the source-channel junction and drain-channel junction. In memory cell array area 12, where heavily doped source and drain areas are not needed, the source/drain implant is blocked by insulating layer 42.

Before further processing of DRAM chip 10, insulating layer 42 may be removed from memory cell array area 12 using a selective etchant which does not affect sidewalls 38 and 40. This selective etching step is preferably performed in the embodiment in which sidewalls 38 and 40 form part of a continuous insulating layer which is resistant to the selective etch. This selective etchant will also remove sidewalls 44, which serve no further purpose, from peripheral area 14. Alternatively, insulating layer 42 may be left in place if insulating layer 42 forms a void-free fill of memory cell array area 12.

Processing of DRAM chip 10 may then proceed according to well-known methods. For example, contacts may be established to source and drain areas 30 and 46, and an inter-level insulating layer may be deposited over memory cell array area 12 and peripheral area 14.

The above-described method allows the formation of more heavily doped source and drain regions in the peripheral area of the DRAM chip while keeping the heavily doped regions separated from the channel regions. This reduces diffusion into the channel regions and allows a smaller design rule to be used for the peripheral circuitry. The method may also reduce stress at the source-channel and drain-channel junctions. Furthermore, the above-described method has no impact on the formation of the DRAM cell array itself. Moreover, because the added steps of this method are self-aligning in nature, the "masking level" of the overall DRAM chip fabrication process is not increased.

While the invention has been particularly shown and described by the foregoing detailed description, it will be understood by those skilled in the art that various other changes in form and detail may be made without departing from the spirit and scope of the invention.

What is claimed is:

1. A method for forming a DRAM chip, comprising the steps of:

depositing a memory cell gate in a memory cell array area of the DRAM chip, the memory cell gate overlying a first channel area of a substrate;

depositing a peripheral gate in a peripheral area of the DRAM chip, the peripheral gate overlying a second channel area of the substrate;

forming first sidewalls adjacent to the memory cell gate and adjacent to the peripheral gate;

implanting a first dopant having a first concentration in a first plurality of regions of the substrate, the first plurality of regions lying predominantly outside the first and second channel areas of the substrate;

forming a second sidewall adjacent to the peripheral gate, the second sidewall overlying a sidewall area of the substrate, the second sidewall is spaced apart from the peripheral gate by the first sidewalls;

implanting a second dopant having a second concentration in a second plurality of regions of the substrate within the peripheral area of the DRAM chip, the second plurality of regions lying predominantly outside the sidewall area of the substrate;

forming an insulating layer over the memory cell array area of the DRAM chip simultaneously with the step of forming the second sidewall adjacent to the peripheral gate; and blocking the implant of the second dopant by the insulating layer.

2. The method of claim 1, wherein the step of forming the second sidewall adjacent to the peripheral gate comprises the steps of:

depositing an insulating layer on the substrate; and etching the insulating layer with an anisotropic etchant.

3. The method of claim 1, wherein the second dopant comprises the first dopant.

4. The method of claim 1, wherein the second concentration is greater than the first concentration.

5. A method for forming a DRAM chip, comprising the steps of:

depositing a memory cell gate in a memory cell array area of the DRAM chip, the memory cell gate overlying a first channel area of a substrate;

depositing a peripheral gate in a peripheral area of the DRAM chip, the peripheral gate overlying a second channel area of the substrate;

forming first sidewalls adjacent to the memory cell gate and adjacent to the peripheral gate;

implanting a first dopant having a first concentration in a first plurality of source and drain regions of the substrate, the first plurality of source and drain regions lying predominantly outside the first and second channel areas of the substrate;

forming a second sidewall adjacent to the peripheral gate and spaced apart from the peripheral gate by the first sidewalls;

implanting a second dopant having a second concentration in a second plurality of source and drain regions of the substrate within the peripheral area of the DRAM chip;

blocking the implant of the second dopant by the second sidewall;

forming an insulating layer over the memory cell array area of the DRAM chip simultaneously with the step of forming the second sidewall adjacent to the peripheral gate; and blocking the implant of the second dopant by the insulating layer.

6. The method of claim 5, further comprising the step of removing the insulating layer from the memory cell array area of the DRAM chip.

7. The method of claim 5, wherein the step of forming the second sidewall adjacent to the peripheral gate comprises the steps of depositing an insulating layer over the substrate; and etching the insulating layer with an anisotropic etchant.

8. The method of claim 5, wherein the second dopant comprises the first dopant.

9. The method of claim 5, wherein the second concentration is greater than the first concentration.

* * * * *